(12) United States Patent
Kim et al.

(10) Patent No.: US 8,247,244 B2
(45) Date of Patent: Aug. 21, 2012

(54) LIGHT EMITTING DEVICE AND METHOD OF MANUFACTURING THE SAME

(75) Inventors: Chang Yeon Kim, Ansan (KR); Yeo Jin Yoon, Ansan (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 14 days.

(21) Appl. No.: 12/882,449

(22) Filed: Sep. 15, 2010

(65) Prior Publication Data

US 2011/0003407 A1 Jan. 6, 2011

Related U.S. Application Data

(62) Division of application No. 12/251,735, filed on Oct. 15, 2008.

(30) Foreign Application Priority Data

Jun. 19, 2008 (KR) .................. 10-2008-0057791

(51) Int. Cl.
*H01L 21/00* (2006.01)
(52) U.S. Cl. ........................................... 438/22
(58) Field of Classification Search .......... 438/22
See application file for complete search history.

(56) References Cited

U.S. PATENT DOCUMENTS

| | | | |
|---|---|---|---|
| 5,779,924 A | 7/1998 | Krames et al. | |
| 6,403,391 B1 * | 6/2002 | Nishimura et al. | 438/22 |
| 2003/0071564 A1 | 4/2003 | Hirayama | |
| 2004/0206962 A1 | 10/2004 | Erchak et al. | |
| 2005/0035354 A1 | 2/2005 | Lin et al. | |
| 2006/0208273 A1 | 9/2006 | Kang | |
| 2007/0158661 A1 | 7/2007 | Lu et al. | |

OTHER PUBLICATIONS

U.S. Final Office Action dated May 18, 2011 (from co-pending U.S. Appl. No. 12/251,735).
U.S. Office Action dated Dec. 1, 2010 (from co-pending U.S. Appl. No. 12/251,735).
Non-Final Office Action of U.S. Appl. No. 12/251,735 dated Jul. 2, 2012.

* cited by examiner

*Primary Examiner* — Anthony Ho
(74) *Attorney, Agent, or Firm* — H.C. Park & Associates, PLC

(57) ABSTRACT

There are provided a light emitting device and a method of manufacturing the same. A light emitting device according to the present invention includes a substrate; an N-type semiconductor layer, an active layer and a P-type semiconductor layer, sequentially formed on the substrate; one or more trenches formed to expose the N-type semiconductor layer by partially removing at least the P-type semiconductor and active layers; a first insulating layer formed on sidewalls of the trenches; and a conductive layer filled in the trenches having the first insulating layer formed therein. According to the present invention, it is possible to obtain a characteristic of uniform current diffusion, and thus, light is uniformly emitted to thereby enhance the light emitting efficiency.

10 Claims, 5 Drawing Sheets

LIGHT EMITTING DEVICE AND METHOD OF MANUFACTURING THE SAME

CROSS REFERENCE TO RELATED APPLICATION

This application is a divisional of U.S. patent application Ser. No. 12/251,735, filed Oct. 15, 2008, and claims priority from and the benefit of Korean Patent Application No. 10-2008-0057791, filed on Jun. 19, 2008, which are all hereby incorporated by reference for all purposes as if fully set forth herein.

BACKGROUND OF THE INVENTION

1. Field of the Invention

The present invention relates to a light emitting device and a method of manufacturing the same, and more particularly, to a light emitting device, wherein trenches of a mesh structure are formed by etching a P-type semiconductor layer and an active layer to expose an N-type semiconductor layer and a conductive layer is formed by being filled in the trenches, and a method of manufacturing the same.

2. Description of the Related Art

In general, since nitrides, such as GaN, AlN and InN, have an excellent thermal stability and a direct-transition-type energy band structure, they have recently come into the spotlight as materials for photoelectric devices in blue and ultraviolet regions. Particularly, since GaN has a very large energy bandgap of 3.4 eV at normal temperature, it may be used as a high-temperature and high-output device. Since the GaN is combined with a material such as InN or AlN and an energy bandgap of the GaN can be controlled from 1.9 eV (InN) to 3.4 eV (GaN) or 6.2 eV (AlN), the GaN can emit light in a broad wavelength range of visible light to UV light. For this reason, the GaN is a material having high applicability to optical devices.

A light emitting device using GaN generally includes an N-type GaN layer, an active layer and a P-type GaN layer, which are laminated and formed on a substrate, and N-type and P-type electrodes respectively connected to the N-type and P-type GaN layers. When a predetermined current is applied to the N-type and P-type electrodes of the light emitting device, electrons provided from the N-type GaN layer and holes provided from the P-type GaN layer are recombined in the active layer, thereby emitting short-wavelength light corresponding to green or blue.

Since the P-type GaN layer has a low conductivity, a conductive layer is formed on the P-type GaN layer so that current is effectively diffused. The conductive layer is formed to have a double-layered structure of Ni and Au of a few tens to a few hundreds of angstroms (Å). However, since when using the double-layered structure of Ni and Au, the transparency thereof is lowered and photons are absorbed therein, the quantum efficiency is lowered. A high-efficiency light emitting device should simultaneously have a characteristic of current uniformly diffused in a large area and a high external quantum effect. To this end, the transparency is improved by forming a transparent electrode between the P-type GaN layer and the P-type electrode, and the current diffusion characteristic is improved by forming an extension electrode extending from the P-type electrode. The extension electrode is connected to the P-type electrode and formed to extend along the outline of the light emitting device in the shape of a wing. However, even when the extension electrode is formed as described above, current is not uniformly diffused, and therefore, light is not uniformly emitted. That is, light emitted between the P-type electrode and the extension electrode adjacent to the P-type electrode is dark, and light emitted between the N-type electrode and the extension electrode adjacent to the N-type electrode is bright.

SUMMARY OF THE INVENTION

The present invention provides a light emitting device capable of emitting uniform light by uniformly diffusing current, and a method of manufacturing the same.

The present invention also provides a light emitting device, wherein trenches of a mesh structure are formed by etching a P-type semiconductor layer and an active layer to expose an N-type semiconductor layer and a conductive layer connected to an electrode formed on the N-type semiconductor layer is formed by being filled in the trenches to thereby diffuse current uniformly, and a method of manufacturing the same.

According to an aspect of the present invention, there is provided a light emitting device, which includes a substrate; an N-type semiconductor layer, an active layer and a P-type semiconductor layer, sequentially formed on the substrate; one or more trenches formed to expose the N-type semiconductor layer by partially removing at least the P-type semiconductor and active layers; a first insulating layer formed on sidewalls of the trenches; and a conductive layer filled in the trenches having the first insulating layer formed therein.

The light emitting device may further include a transparent electrode formed on the P-type semiconductor layer; a first electrode electrically connected to the conductive layer and formed on the N-type semiconductor layer; and a second electrode formed on the transparent electrode. At least a portion of the transparent electrode may be removed so that at least a portion of the P-type semiconductor layer is exposed, and the second electrode may be formed to be in contact with the exposed P-type electrode.

The trenches may be formed to have a mesh structure.

The light emitting device may further include a second insulating layer formed between the conductive layer and the transparent electrode.

The trenches may have an interval wider than a width.

According to another aspect of the present invention, there is provided a method of manufacturing a light emitting device, which includes sequentially forming an N-type semiconductor layer, an active layer and a P-type semiconductor layer on a substrate; etching the P-type semiconductor and active layers, thereby forming a trench of a mesh structure to expose the N-type semiconductor layer; and forming a conductive layer to be filled in the trench.

A hole may be further formed to expose the N-type semiconductor layer together with the trench of a mesh structure. The method may further include forming a first electrode on the N-type semiconductor layer in the hole.

After forming the conductive layer, the method may further include forming a second insulating layer on the conductive layer.

After forming the second insulating layer, the method may further include forming a transparent electrode on the P-type semiconductor layer; and forming a second electrode on the transparent electrode.

Before forming the second electrode, the method may further include removing at least a portion of the transparent electrode so that a portion of the P-type semiconductor layer is exposed before forming the second electrode, wherein the second electrode is formed to be in contact with the exposed P-type semiconductor layer.

DETAILED DESCRIPTION OF THE INVENTION

Figure 1:
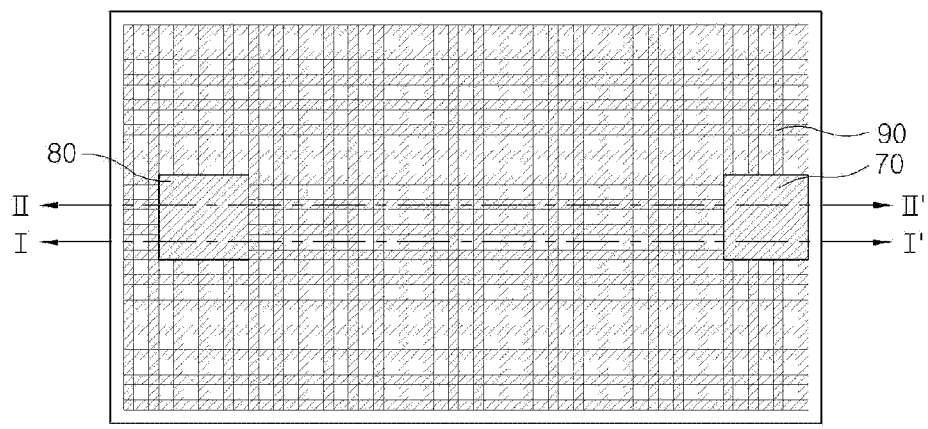
FIG. 1 is a schematic plan view of a light emitting device according to an embodiment of the present invention.

Hereinafter, exemplary embodiments of the present invention will be described in detail with reference to the accompanying drawings. However, the present invention is not limited to the embodiments disclosed below but may be implemented into different forms. These embodiments are provided only for illustrative purposes and for full understanding of the scope of the present invention by those skilled in the art. In the drawings, the thicknesses of layers and regions are exaggerated for clarity, and like reference numerals are used to designate like elements throughout the specification and drawings. Further, an expression that an element such as a layer, region, substrate or plate is placed "on" or "above" another element indicates not only a case where the element is placed "directly on" or "just above" the other element but also a case where a further element is interposed between the element and the other element.

Figure 2:
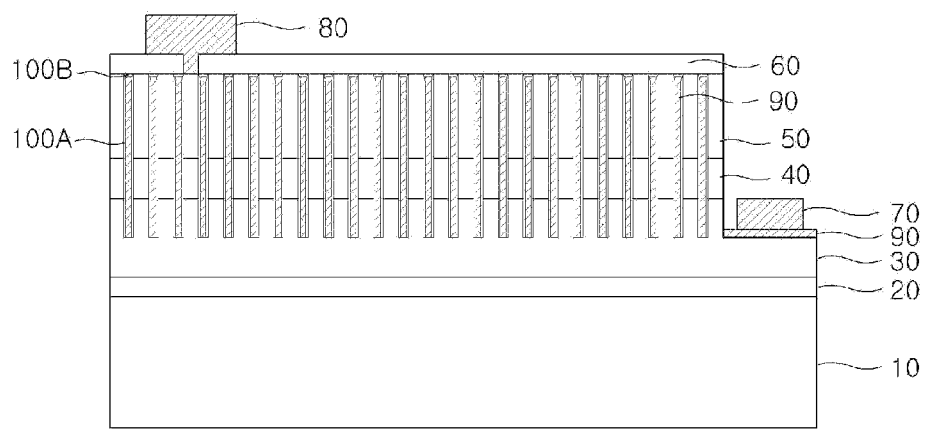
FIG. 2 is a sectional view taken along line I-I' of FIG. 1.
Figure 3:
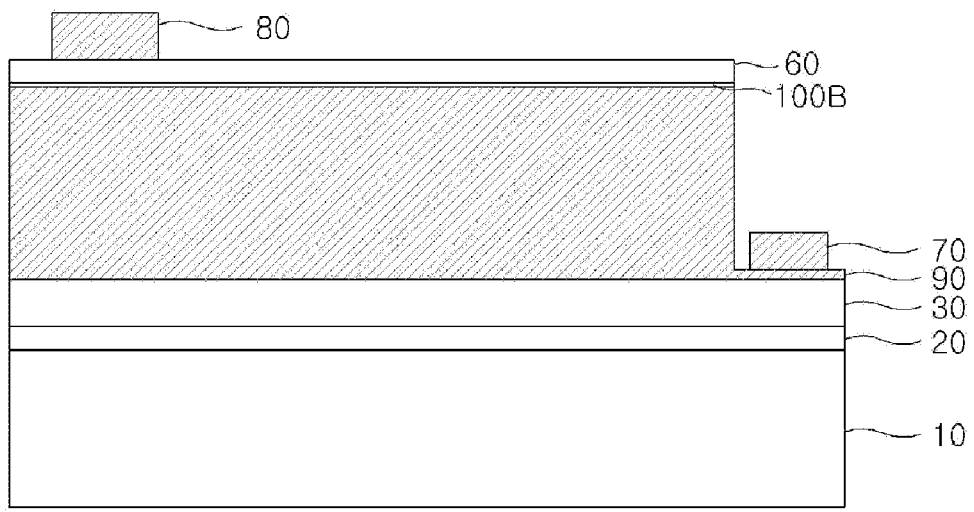
FIG. 3 is a sectional view taken along line II-II' of FIG. 1.
Figure 4:
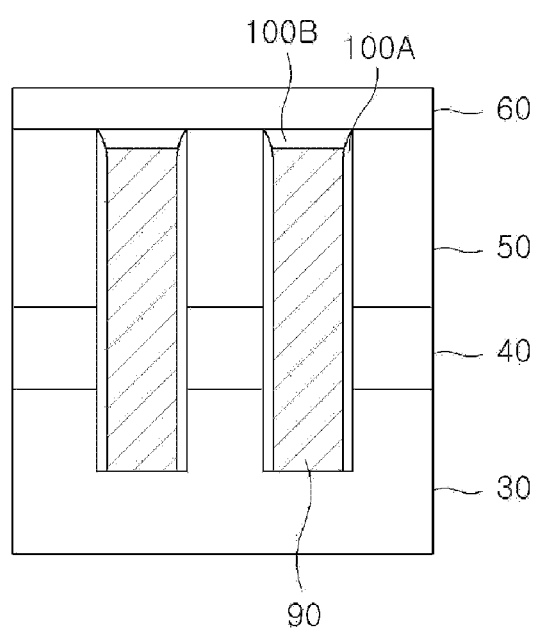
FIG. 4 is an enlarged sectional view of a conductive layer filled in trenches of the light emitting device according to the embodiment of the present invention.

FIG. 1 is a schematic plan view of a light emitting device according to an embodiment of the present invention. FIGS. 2 and 3 are sectional views taken along lines I-I' and II-II' of FIG. 1, respectively. FIG. 4 is an enlarged sectional view of a conductive layer filled in trenches of the light emitting device according to the embodiment of the present invention.

Referring to FIGS. 1 to 4, the light emitting device according to the embodiment of the present invention includes a buffer layer 20, an N-type semiconductor layer 30, an active layer 40, a P-type semiconductor layer 50 and a transparent electrode 60, which are sequentially formed on a substrate 10, and first and second electrodes 70 and 80 respectively formed on the N-type and P-type semiconductor layers 30 and 50. The light emitting device further includes a conductive layer 90 connected to the first electrode 70 and filled in trenches of a mesh structure, wherein the trenches are formed by etching the P-type semiconductor layer 50 and the active layer 40 to expose the N-type semiconductor layer 30. Also, the light emitting device further includes an insulating layer 100 for insulating the conductive layer 90 from the active layer 40, the P-type semiconductor layer 50 and the transparent electrode 60.

The substrate 10 refers to a typical wafer for manufacturing a light emitting device and includes any one of $Al_2O_3$, SiC, ZnO, Si, GaAs, GaP, $LiAl_2O_3$, BN, AlN and GaN.

The buffer layer 20 is formed to reduce lattice mismatch between the substrate 10 and the N-type semiconductor layer 30 when crystals of the N-type semiconductor 30 grows, and is formed of a semiconductor material, GaN or AlN.

The N-type semiconductor layer 30 is a layer for injecting electrons into the active layer 40, and may include a GaN layer doped with an N-type impurity. However, the present invention is not limited thereto, but various material layers having a semiconductor property may be used. That is, the N-type semiconductor layer 30 may include nitrides such as GaN, InN and AlN (Group III-V) and a compound where such nitrides are mixed at a certain ratio. The N-type semiconductor layer 30 may also be formed of a multi-layered film. An N-type clad layer (not shown) may be further formed on the N-type semiconductor layer 30 and may be formed of GaN, AlGaN or InGaN.

The active layer 40 is a region in which a predetermined bandgap and a quantum well are formed and thus electrons and holes are recombined, and may be formed of InGaN. At this time, the wavelength of light generated due to the combination of electrons and holes varies depending on a material of the active layer 40. Therefore, it is preferred that a semiconductor material contained in the active layer 40 be controlled depending on a target wavelength. Further, the active layer 40 may be formed to have a multi-layered structure in which quantum well layers and barrier layers are alternately laminated.

The P-type semiconductor layer 50 is a layer for injecting holes into the active layer 40, and may include a GaN layer doped with a P-type impurity. However, the present invention is not limited thereto, but various material layers having a semiconductor property, for example InGaN, may be used. The P-type semiconductor layer 50 may also be formed of a multi-layered film.

The transparent electrode 60 is formed to decrease a forward voltage by forming an ohmic contact between the P-type semiconductor layer 50 and the second electrode 80 while increasing an area through which current is injected into the P-type semiconductor layer 50. Also, the transparent electrode 60 improves transparency of the light emitting device using a transparent conductive material, e.g., ITO, IZO, ZnO, MgO or the like.

Each of the first and second electrodes 70 and 80 is formed to have a single- or multi-layered structure using a metallic material such as Cr, Au or Al. After a predetermined region of the transparent electrode 60, the P-type semiconductor layer 50 and the active layer 40 is etched to thereby expose a portion of the N-type semiconductor layer 30, the first electrode 70 is formed on the exposed portion of the N-type semiconductor layer 30 to be electrically connected to the conductive layer 90. The second electrode 80 is also formed on the transparent electrode 60. In addition, the second electrode 80 may be formed to be in contact with the P-type semiconductor layer 50 exposed after removing a predetermined region of the transparent electrode 60.

The conductive layer 90 is formed to have a mesh structure, in which a plurality of first lines formed with a predetermined width at intervals in a lateral direction and a plurality of second lines formed with a predetermined width at intervals in a longitudinal direction intersect with each other. The conductive layer 90 of the mesh structure is formed on the N-type semiconductor layer 30 to be connected to the first electrode 70. That is, trenches of a mesh structure are formed so that the N-type semiconductor layer 30 is exposed by etching the P-type semiconductor layer 50 and the active layer 40, and the conductive layer 90 is formed by being filled in the trenches. Here, it is preferred that the interval between the lines be formed wider than the width of each line. For example, the width of each line is formed to be about 5 μm, and the interval between the lines is formed to be about 10 μm. This is because if the interval between the lines of the conductive layer 90 is formed wider than the width of each line, a space through which light is emitted becomes broader, and therefore, light emitting efficiency becomes higher. The width and interval of the conductive layer 90 of the mesh structure may be adjusted depending on the thickness and material of the N-type semiconductor layer 30. The conductive layer 90 may also be formed to have a single- or multi-layered structure, for example using a metallic material such as Cr, Au or Al. The conductive layer 90 may be formed simultaneously with the first electrode 70.

The insulating layer 100 is formed to insulate the active layer 40, the P-type semiconductor layer 50 and the transparent electrode 60 from the conductive layer 90. That is, the insulating layer 100 includes a first insulating layer 100A, which is formed on inner walls of the trenches of a mesh structure to insulate the active layer 40 and the P-type semiconductor layer 50 from the conductive layer 90, and a second insulating layer 100B, which is formed on the conductive layer 90 to insulate the conductive layer 90 from the transparent electrode 60. For example, the insulating layer 100 may be formed of an insulative material such as oxide or nitride.

Meanwhile, the aforementioned material layers may be formed using various deposition or growth methods, including metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), and the like.

Hereinafter, a method of manufacturing a light emitting device configured as described above according to an embodiment of the present invention will be described with is reference to FIGS. 5 and 6.

FIGS. 5A to 5D are sectional views illustrating a method of manufacturing a light emitting device according to an embodiment of the present invention. FIG. 6 is a plan view showing a state where a photoresist is formed in the method of manufacturing a light emitting device according to the embodiment of the present invention.

Figure 5A:
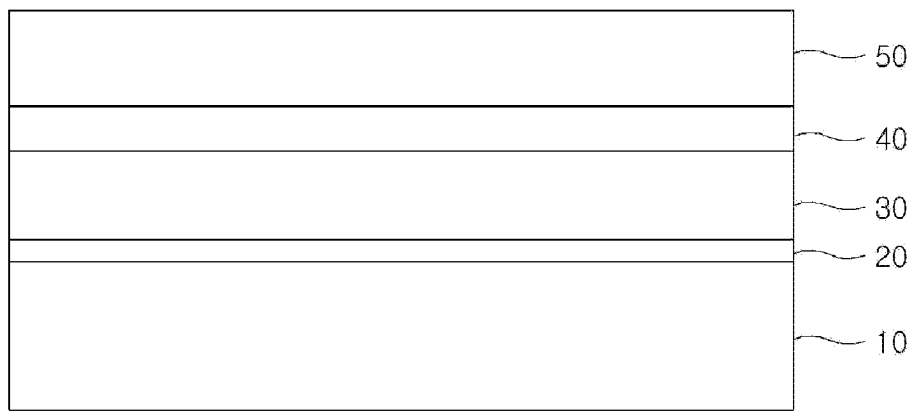
FIGS. 5A to 5D are sectional views illustrating a method of manufacturing a light emitting device according to an embodiment of the present invention.

Referring to FIG. 5A, a buffer layer 20, an N-type semiconductor layer 30, an active layer 40 and a P-type semiconductor layer 50 are sequentially formed on a substrate 10. The buffer layer 20 includes, for example, a GaN layer, and the N-type semiconductor layer 30 includes, for example, a GaN layer doped with an N-type impurity. The active layer 40 is formed to have a single quantum well (SQW) structure, a double hetero (DH) structure or a multiple quantum well (MQW) structure, for example, including an InGaN layer, and the P-type semiconductor layer 50 includes a GaN layer doped with a P-type impurity.

The buffer layer 20 is formed by depositing a GaN layer at a temperature of 450 to 550° C. using ammonia ($NH_3$) and trimethylgallium (TMGa) as nitrogen and gallium (Ga) sources. Instead of the GaN layer, various material layers such as an AlN layer, a GaInN layer, an AlGaInN layer and a SiN layer may be used as the buffer layer, and the growth temperature and thickness of the material layers may be different depending on devices or growth systems.

Subsequently, the N-type semiconductor layer 30 is formed on the buffer layer 20 and includes, for example, a GaN layer doped with an N-type impurity. To this end, a GaN layer doped with silicon is formed at a temperature of about 900 to 1000° C. using TMGa as a gallium source, $NH_3$ as a nitrogen source, and $SiH_4$ or $SiH_6$ as the n-type impurity.

Thereafter, the active layer 40 is formed on the N-type semiconductor layer 30 to have an SQW structure, a DH structure or an MQW structure, for example, including an InGaN layer. To this end, the InGaN layer is formed at a temperature of 700 to 850° C. using trimethylindium (TMIn) or triethylindium (TEIn), TMGa or triethylgallium (TEGa), and $NH_3$ as indium, gallium and nitrogen sources, respectively.

Then, after the active layer 40 is formed, a P-type GaN layer is formed as the P-type semiconductor layer 50 using gallium, nitrogen and magnesium sources while maintaining a temperature of 900 to 1100° C.

Meanwhile, the N-type and P-type semiconductor layers 30 and 50 may be formed of InN, AlN or the like, instead of GaN. In this case, an indium or aluminum source is used instead of the gallium source.

Figure 5B:
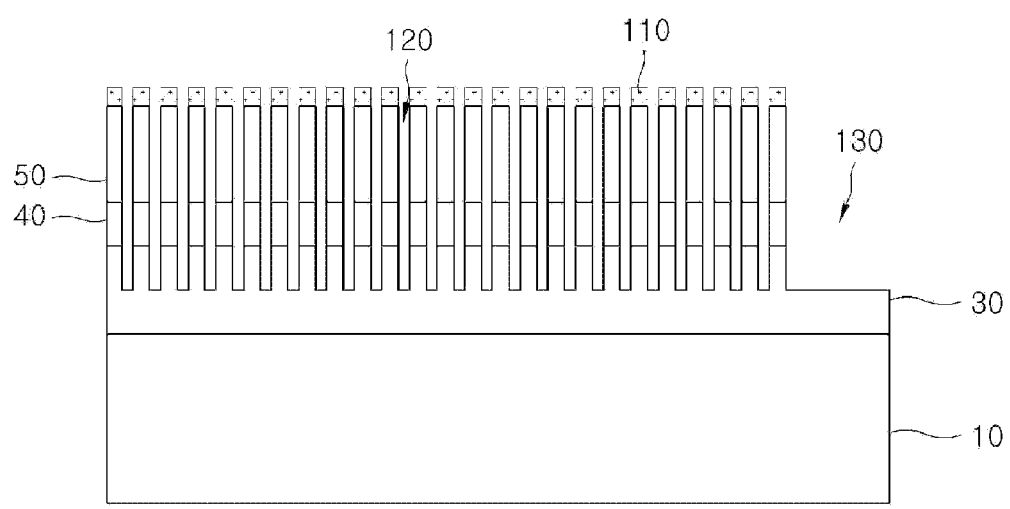
Figure 6:
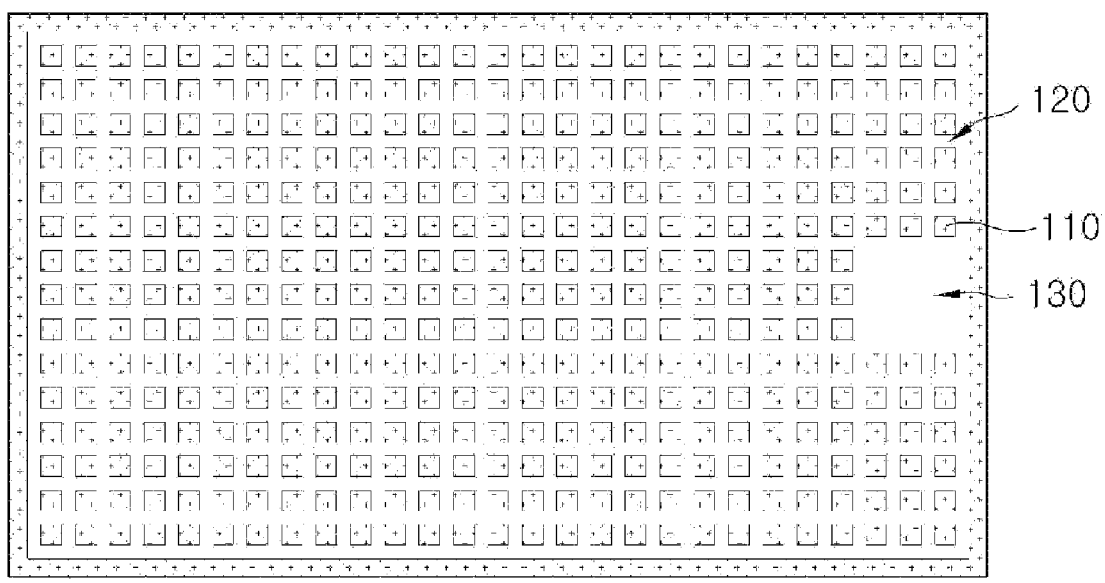
FIG. 6 is a plan view showing a state where a photoresist is formed in the method of manufacturing a light emitting device according to the embodiment of the present invention.

Referring to FIGS. 5B and 6, a photoresist 110 is formed on the P-type semiconductor layer 50 and then patterned through a photo and development process using a predetermined mask. The photoresist 110 may be patterned in the form of a plurality of rectangles spaced apart from one another. The photoresist 110 is patterned so that the P-type semiconductor layer 50 is exposed into a mesh structure, and a predetermined region of the P-type semiconductor layer 50 is exposed to be larger than the width and interval of the mesh structure. Here, the photoresist 110 is patterned so that a region of the photoresist 110 exposed into the mesh structure has an interval of about 10 μm and a width of about 5 μm. The P-type semiconductor layer 50 and the active layer 40 are etched using the photoresist 110 patterned as described above as a mask. At this time, the N-type semiconductor layer 30 may be etched to a predetermined thickness by performing over-etching. Accordingly, trenches 120 of a mesh structure and a hole 130 with predetermined dimensions are formed.

Figure 5C:
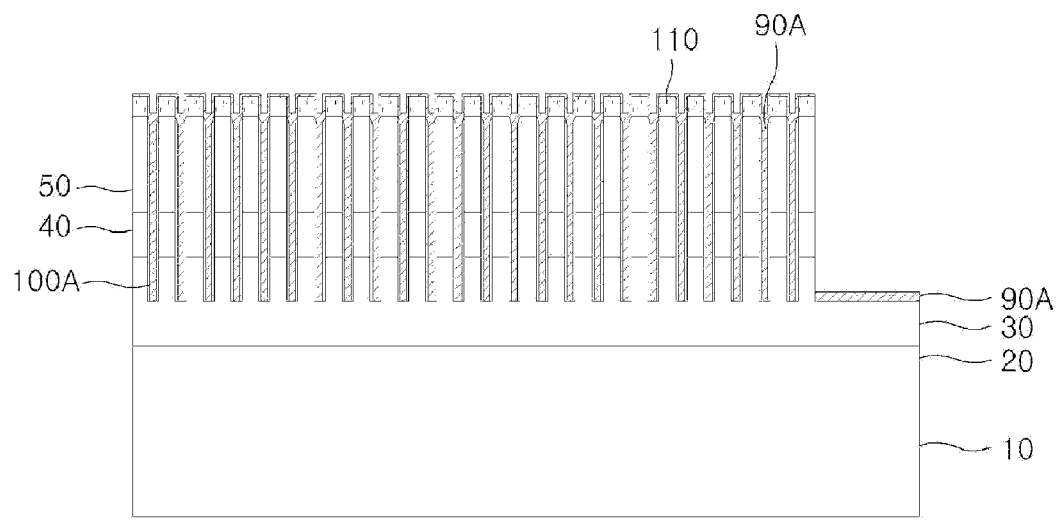

Referring to FIG. 5C, a first insulating layer 100A having a predetermined thickness is formed on the entire structure. Here, the first insulating layer 100A is formed to a thickness so that the trenches 120 are not filled with the first insulating layer 100A. The first insulating layer 100A formed on a top of the photoresist 110 and bottoms of the trenches 120 and a hole 130 is removed by performing an entire surface etching process. That is, the first insulating layer 100A formed on the N-type semiconductor layer 30. Therefore, the first insulating layer 100A remains only on sidewalls of the trenches 120 and the hole 130, i.e., sidewalls of the active layer 40 and the P-type semiconductor layer 50. Subsequently, a conductive material 90A is formed on the entire structure to be filled in the trenches 120.

Figure 5D:
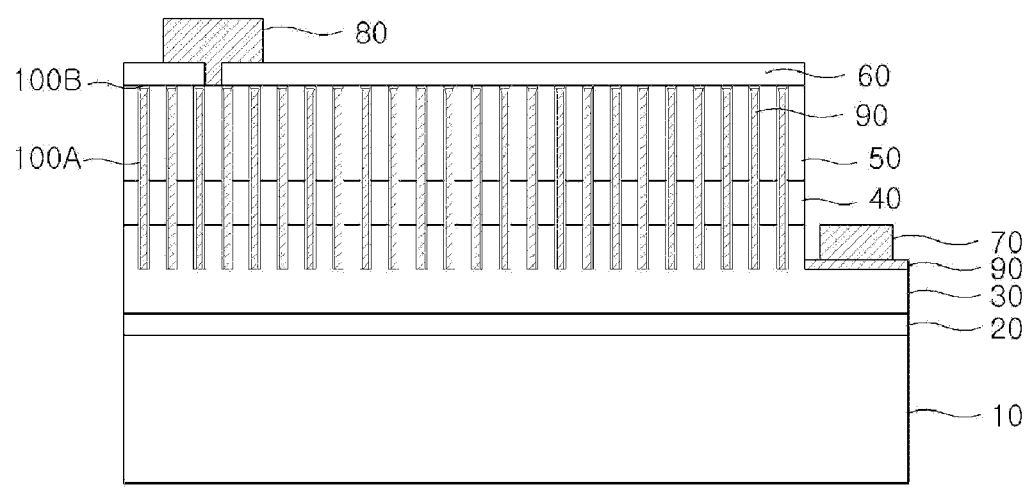

Referring to FIG. 5D, the photoresist 110 is removed through a lift-off process. Accordingly, the conductive material 90A remaining on the top of the photoresist 110 is also removed. Therefore, a conductive layer 90 is formed to be filled in the trenches 120 of the mesh structure. At this time, the conductive layer 90 is formed to partially extend to a region at which a first electrode 70 will be formed. Subsequently, a second insulating layer 100B is formed on the entire structure, and then, photolithography and etching processes are performed so that the second insulating layer 100B remains on the conductive layer 90. A transparent electrode 60 is formed on the entire structure, for example, using ITO. Subsequently, the transparent electrode 60 is etched so that the P-type semiconductor layer 50 is partially exposed and the N-type semiconductor layer 30 is exposed. A first electrode 70 is formed on the exposed N-type semiconductor layer 30, and a second electrode 80 is formed on the transparent electrode 60 so as to be in contact with the exposed P-type semiconductor layer 50.

In this embodiment, after the conductive layer 90 is formed, the first and second electrodes 70 and 80 are simultaneously formed. However, after the conductive layer 90 and the first electrode 70 are simultaneously formed, the second electrode 80 may be formed. Also, such a process may be variously modified.

Meanwhile, the gallium source may include triethylgallium (TEGa) in addition to trimethylgallium (TMGa), while the aluminum source may include triethylaluminum (TEAl), trimethylaminealuminum (TMAAl) or dimethylethylaminealuminum (DMEAAl) in addition to trimethylaluminum (TMAl). The nitrogen source may include monomethylhydrazine (MMHy) or dimethylhydrazine (DMHy) in addition to ammonia ($NH_3$).

In a light emitting device according to the present invention, trenches of a mesh structure are formed by etching a P-type semiconductor layer and an active layer to expose an N-type semiconductor layer, and a conductive layer is formed on the N-type semiconductor layer by being filled in the trenches. Then, a first electrode connected to the conductive layer is formed on the N-type semiconductor layer. Also, before the conductive layer is formed, an insulating layer is formed on sidewalls of the trenches, so that the conductive layer is insulated from the P-type semiconductor layer and the active layer.

According to the present invention, a conductive layer is formed on an N-type semiconductor layer, and a first electrode is formed on the N-type semiconductor layer so as to be connected to the conductive layer, thereby obtaining a characteristic of uniform current diffusion. Accordingly, light is uniformly emitted, thereby enhancing the light emitting efficiency.

Although the technical spirit of the present invention has been described in detail in connection with the embodiments, it is noted that the embodiments are only for illustrative purposes and not for limitation. Also, it will be understood by those skilled in the art that various embodiments can be made thereto within the scope of the technical spirit of the invention.

What is claimed is:

1. A method of manufacturing a light emitting device, the method comprising:
    forming an N-type semiconductor layer, an active layer, and a P-type semiconductor layer on a substrate;
    etching the P-type semiconductor layer and active layer to form a plurality of trenches arranged in a mesh structure, the trenches to expose the N-type semiconductor layer; and
    forming a mesh structured conductive layer directly on and in contact with the N-type semiconductor layer by disposing a conductive material in the trenches.

2. The method of claim 1, further comprising forming a hole by etching the P-type semiconductor layer and active layer to expose the N-type semiconductor layer.

3. The method of claim 2, further comprising forming a first electrode on the N-type semiconductor layer in the hole.

4. The method of claim 3, wherein the first electrode is electrically connected with the mesh structured conductive layer.

5. The method of claim 3, wherein the first electrode directly contacts the mesh structured conductive layer.

6. The method of claim 1, further comprising forming a first insulating layer on sidewalls of the trenches before forming the conductive layer.

7. The method of claim 1, further comprising forming a second insulating layer on the conductive layer.

8. The method of claim 7, further comprising:
    forming a transparent electrode on the P-type semiconductor layer after forming the second insulating layer; and
    forming a second electrode on the transparent electrode.

9. The method of claim 1, wherein the mesh structured conductive layer does not directly contact the P-type layer and the active layer.

10. A method of manufacturing a light emitting device, the method comprising:
    forming an N-type semiconductor layer, an active layer, and a P-type semiconductor layer on a substrate;
    etching the P-type semiconductor layer and active layer to form a plurality of trenches comprising a mesh structure, the trenches to expose the N-type semiconductor layer;
    forming a conductive layer on the N-type semiconductor layer by disposing a conductive material in the trenches;
    forming an insulating layer on the conductive layer;
    forming a transparent electrode on the P-type semiconductor layer after forming the insulating layer;
    forming a second electrode on the transparent electrode; and
    removing at least a portion of the transparent electrode to expose a portion of the P-type semiconductor layer before forming the second electrode, wherein the second electrode is formed to be in contact with the exposed P-type semiconductor layer.

* * * * *